United States Patent
Li

(10) Patent No.: US 9,779,684 B2
(45) Date of Patent: Oct. 3, 2017

(54) GATE DRIVER ON ARRAY CIRCUIT AND DISPLAY USING THE SAME

(71) Applicant: WUHAN CHINA STAR OPTOELECTRONICS TECHNOLOGY CO., LTD., Wuhan, Hubei (CN)

(72) Inventor: Yafeng Li, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 26 days.

(21) Appl. No.: 14/906,702

(22) PCT Filed: Dec. 22, 2015

(86) PCT No.: PCT/CN2015/098300
§ 371 (c)(1),
(2) Date: Jan. 21, 2016

(87) PCT Pub. No.: WO2017/092089
PCT Pub. Date: Jun. 8, 2017

(65) Prior Publication Data
US 2017/0236479 A1  Aug. 17, 2017

(30) Foreign Application Priority Data
Dec. 1, 2015 (CN) .......................... 201510872318.3

(51) Int. Cl.
*G09G 3/36* (2006.01)

(52) U.S. Cl.
CPC ......... *G09G 3/3677* (2013.01); *G09G 3/3696* (2013.01); *G09G 2300/0809* (2013.01)

(58) Field of Classification Search
CPC ......... G09G 3/3677; G09G 2310/0286; G09G 2300/0408; G09G 2310/0267;
(Continued)

(56) References Cited

U.S. PATENT DOCUMENTS 7,233,308 B2 * 6/2007 Park ..................... G09G 3/3677
345/100
8,289,261 B2 * 10/2012 Lee ..................... G09G 3/3266
324/333

(Continued)

*Primary Examiner* — Duc Dinh
(74) *Attorney, Agent, or Firm* — Ladas & Parry LLP

(57) ABSTRACT

A GOA circuit includes GOA circuit units coupled in series. Each GOA circuit unit includes an input control module, an output control module, a pull-down module, and a pull-up holding module. The input control module includes a first transistor, a second transistor, a third transistor, and a fourth transistor. Each GOA circuit unit includes ten transistors. Because the GOA circuit unit proposed by the present invention comprises fewer transistors, it is good for being used in displays with a narrow bezel. In addition, the GOA circuit unit comprises an input control module comprising a second transistor and a third transistor controlled by a first gate turn-on signal. A first transistor and the second transistor are connected in series, and the third transistor and a fourth transistor are connected in series, which reduces leakage current. It provides a beneficiary effect that the stability of the GOA circuit unit is improved.

16 Claims, 3 Drawing Sheets

(58) Field of Classification Search
CPC .............. G09G 3/3266; G09G 3/3674; G09G 2330/021; G09G 2310/0202; G09G 2310/0289; G09G 2310/0251; G09G 2300/0871
USPC .............................. 345/204, 690, 98, 99, 200
See application file for complete search history.

(56) References Cited

U.S. PATENT DOCUMENTS

| | | | | |
|---|---|---|---|---|
| 8,363,777 B2 * | 1/2013 | Lin | ...................... | G09G 3/3677 377/64 |
| 8,723,844 B2 * | 5/2014 | Ko | ...................... | G09G 3/3677 345/204 |
| 8,766,958 B2 * | 7/2014 | Zhang | .................. | G09G 3/3677 345/204 |
| 8,774,348 B2 * | 7/2014 | Lin | ...................... | G09G 3/3677 377/64 |
| 2008/0266477 A1 * | 10/2008 | Lee | ...................... | G09G 3/3677 349/46 |
| 2008/0309597 A1 * | 12/2008 | Nam | .................... | G09G 3/3677 345/87 |
| 2009/0040203 A1 * | 2/2009 | Kim | ..................... | G09G 3/3677 345/204 |

* cited by examiner

US 9,779,684 B2

GATE DRIVER ON ARRAY CIRCUIT AND DISPLAY USING THE SAME

BACKGROUND OF THE INVENTION

1. Field of the Invention

The present invention relates to a display, and more particularly, to a display using a gate driver on array (GOA) circuit.

2. Description of the Prior Art

A gate driver is disposed on a glass substrate comprising a thin film transistor (TFT) in the process of a thin film transistor liquid crystal display (TFT-LCD) array for performing row-by-row scanning. This is what a GOA circuit is.

When a touch device functions, a display panel and a touch panel works at the same time. A GOA circuit used in the display panel has to be suspended to output a scanning signal to a TFT array substrate periodically with the scanning period of the touch panel so that the display panel can be at the mode of black screening. Before the GOA circuit restart to output a scanning signal, it is necessary to wake the display panel at the mode of black screening up. In other words, all of the scanning lines in the GOA circuit need to be conducted for a period of time so that specific low voltage can be output through all of the scanning lines. In this way, the remaining charges in the capacitor of the pixel can be completely cleared so that image sticking is prevented. This period of time is called the stage of all gate on.

The GOA circuit comprises a plurality of GOA circuit units. Each of the plurality of GOA circuit units are fabricated from a plurality of transistors. The GOA circuit is formed on one lateral side of the glass substrate directly. So, the fewer the transistors forming the GOA circuit unit are, the more the unoccupied room of the glass substrate is. A display comprising a GOA circuit unit comprising fewer transistors is good to be equipment with a narrow frame.

Therefore, the IT industry strives to create a GOA circuit comprising a GOA circuit unit comprising fewer transistors.

SUMMARY OF THE INVENTION

In light of the problem mentioned above, an object of the present invention is to propose a GOA circuit and a display panel adopting the GOA circuit for resolving the problem happening in the conventional technology.

According to the present invention, a gate driver on array (GOA) circuit comprises a plurality of GOA circuit units coupled in series. Each GOA circuit unit is used for outputting a scanning signal at an output terminal according to a scanning signal output by a GOA circuit unit at a previous stage, a scanning signal output by a GOA circuit unit at a next stage, a first clock signal, a second clock signal, a third clock signal, a fourth clock signal, a first gate turn-on signal, and a second gate turn-on signal. Each GOA circuit unit comprises an input control module, an output control module, a pull-down module, and a pull-up holding module. The input control module is used for outputting a controlling signal at a controlling node according to the first clock signal, the third clock signal, and the first gate turn-on signal. The input control module comprises a first transistor, a second transistor, a third transistor, and a fourth transistor. The first transistor comprises a gate electrically connected to the first clock signal, a drain electrically connected to the scanning signal output by the GOA circuit unit at the previous stage. The second transistor comprises a gate electrically connected to the first gate turn-on signal, a drain electrically connected to a source of the first transistor, and a source electrically connected to the controlling node. The third transistor comprises a gate electrically connected to the first gate turn-on signal, and a drain electrically connected to a source of the second transistor. The fourth transistor comprises a gate electrically connected to the third clock signal, a drain electrically connected to a source of the third transistor, and a source electrically connected to the scanning signal output by the GOA circuit unit at the next stage. The output control module, electrically connected to the controlling node, is used for outputting the scanning signal at the output terminal according to the controlling signal and the second clock signal. The pull-down module, electrically connected to the output control module, is used for pulling the scanning signal down to be at low level. The pull-up holding module, electrically connected to the output terminal and the second gate turn-on signal, is used for keeping the scanning signal output by the output terminal at high level when receiving the second gate turn-on signal.

In one aspect of the present invention, the output control module comprises: a fifth transistor, comprising a gate electrically connected to a first constant voltage, and a drain electrically connected to the controlling node; a sixth transistor, comprising a gate electrically connected to a source of the fifth transistor, a drain electrically connected to the second clock signal, and a source electrically connected to the output terminal; and a capacitor comprising two terminals connected to the source and the gate of the sixth transistor, respectively.

In another aspect of the present invention, the pull-down module comprises: a seventh transistor, comprising a gate electrically connected to the first gate turn-on signal, and a drain electrically connected to the output terminal and the source of the sixth transistor; an eighth transistor, comprising a gate electrically connected to the fourth clock signal, a drain electrically connected to a source of the seventh transistor, and a source electrically connected to a second constant voltage.

In another aspect of the present invention, the pull-up holding module comprises: a ninth transistor, comprising a gate electrically connected to the second gate turn-on signal, a drain electrically connected to the controlling node, and a source electrically connected to the second constant voltage; and a tenth transistor, comprising a gate electrically connected to the second gate turn-on signal, a drain electrically connected to the first constant voltage, and a source electrically connected to the output terminal.

In another aspect of the present invention, the pull-up holding module comprises: a ninth transistor, comprising a gate electrically connected to the second gate turn-on signal, a drain electrically connected to the controlling node, and a source electrically connected to the second constant voltage; and a tenth transistor, comprising a gate and a drain electrically connected to the second gate turn-on signal, and a source electrically connected to the output terminal.

In another aspect of the present invention, a pulse of the first clock signal, a pulse of the second clock signal, a pulse of the third clock signal, and a pulse of the fourth clock signal are alternatively output, and time periods of the four pulses never overlap with one another.

In still another aspect of the present invention, the first constant voltage is at high level, and the second constant voltage is at low level.

In yet another aspect of the present invention, the first gate turn-on signal is an inversion of the second gate turn-on signal, and the second gate turn-on signal is an inversion of the first gate turn-on signal.

According to the present invention, a display comprises a source driver for outputting data signal to a plurality of pixel units to show grey levels and a gate driver on array (GOA) circuit as mentioned above.

In contrast to prior art, the GOA circuit unit at each stage comprises ten transistors in the present invention. Because the GOA circuit unit proposed by the present invention comprises fewer transistors, it is good for being used in displays with a narrow bezel. In addition, the GOA circuit unit comprises an input control module comprising a second transistor and a third transistor controlled by a first gate turn-on signal. A first transistor and the second transistor are connected in series, and the third transistor and a fourth transistor are connected in series, which reduces leakage current. It provides a beneficiary effect that the stability of the GOA circuit unit is improved.

These and other features, aspects and advantages of the present disclosure will become understood with reference to the following description, appended claims and accompanying figures.

DETAILED DESCRIPTION OF THE PREFERRED EMBODIMENTS

Figure 1:
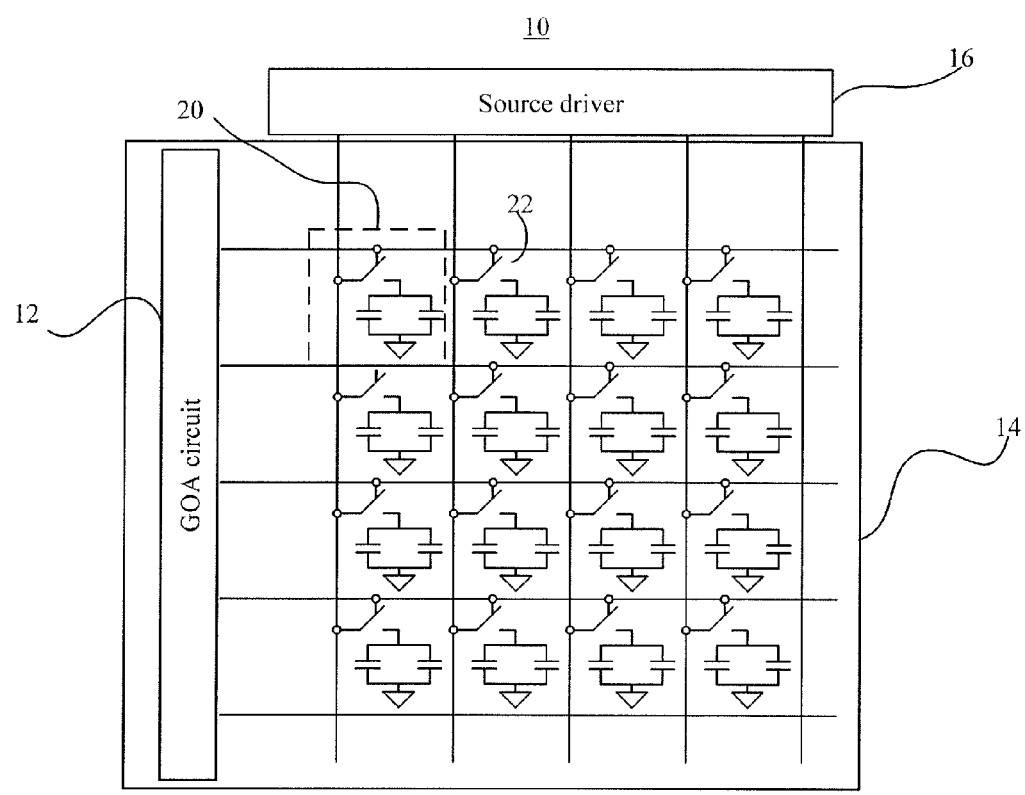
FIG. 1 is a functional block diagram showing a display according to a preferred embodiment of the present invention.

Please refer to FIG. 1. FIG. 1 is a functional block diagram showing a display 10 according to a preferred embodiment of the present invention. The display 10 may be a liquid crystal display (LCD) or an organic light emitting diode (OLED) display. The display 10 comprises a glass substrate 14 and a source driver 16. A plurality of pixels and a GOA circuits 12 arranged in a matrix. Each of the plurality of pixels comprises three pixel units 20. The pixel units 20 represents prime colors, i.e., red (R), green (G), and blue (B), respectively. Take the LCD 10 with a resolution of 1024×768 for example. The LCD 10 comprises 1024×768×3 pixel units 20. The GOA circuit 12 outputs a scanning signal to turn on the transistors 22 in each row consecutively. Meanwhile, the source driver 16 outputs a corresponding data signal to the pixel units 20 in an entire column to charge the pixel units 20 to fulfillment. The variety of grayscale is shown. After the transistors 22 in each row finish being charged, the scanning signal in the row of GOA circuits 12 is canceled. Then, the GOA circuit 12 outputs a scanning signal to turn on the transistors 22 in the next row again. Subsequently, the source driver 16 charges and discharges the pixel units 20 in the next row. Step by step, after all of the pixel units 20 complete being charged, the pixel units 20 in the first row restart to be charged.

The trend for LCD panels is that the GOA circuit 12 outputs a scanning signal at regular intervals. Take the LCD 10 with a resolution of 1024×768 and a frame rate of 60 Hz for example. The show time for each frame is approximately 1/60=16.67 ms. So the pulse of each scanning signal is 16.67 ms/768=21.7 μs. The pixel unit 20 is charged and discharged by the source driver 16 during the period of 21.7 μs until the needed voltage is achieved. As a result, the grayscale in contrast is shown.

Figure 2:
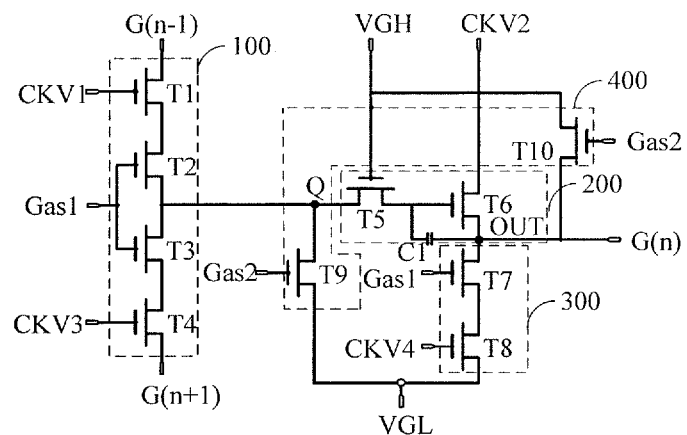
FIG. 2 is a circuit diagram of a GOA circuit unit according to a first embodiment of the present invention.

Please refer to FIG. 2. FIG. 2 is a circuit diagram of a GOA circuit unit SR(n) according to a first embodiment of the present invention. A GOA circuit 12 comprises a plurality of GOA circuit units SR(n) connected in cascade. The GOA circuit unit SR(n) at each stage is used for outputting a scanning signal G(n) at an output terminal OUT according to a scanning signal G(n−1) output by a GOA circuit unit SR(n−1) at a previous stage, a scanning signal G(n+1) output by a GOA circuit unit SR(n+1) at a next stage, a first clock signal CKV1, a second clock signal CKV2, a third clock signal CKV3, a fourth clock signal CKV4, a first gate turn-on signal Gas1, and a second gate turn-on signal Gas2. The GOA circuit unit SR(n) at each stage comprises an input control module 100, an output control module 200, a pull-down module 300, and a pull-up holding module 400. The input control module 100 is used for outputting a controlling signal Q(n) at a controlling node Q according to the first clock signal CKV1, the third clock signal CKV3, and the first gate turn-on signal Gas1. The input control module 100 comprises a first transistor T1, a second transistor T2, a third transistor T3, and a fourth transistor T4. A gate of the first transistor T1 is electrically connected to the first clock signal CKV1. A drain of the first transistor T1 is electrically connected to the scanning signal G(n−1) output by the GOA circuit unit SR(n−1) at the previous stage. A gate of the second transistor T2 is electrically connected to the first gate turn-on signal Gas1. A drain of the second transistor T2 is electrically connected to a source of the first transistor T1. A source of the second transistor T2 is electrically connected to the controlling node Q. A gate of the third transistor T3 is electrically connected to the first gate turn-on signal Gas1. A drain of the third transistor T3 is electrically connected to a source of the second transistor T2. A gate of the fourth transistor T4 is electrically connected to the third clock signal CKV3. A drain of the fourth transistor T4 is electrically connected to a source of the third transistor T3. A source of the fourth transistor T4 is electrically connected to the scanning signal G(n+1) output by the GOA circuit unit SR(n+1) at the next stage. The output control module 200 is electrically connected to the controlling node Q and used for outputting a scanning signal G(n) at the output terminal OUT according to the controlling signal Q(n) and the second clock signal CKV2. The pull-down module 300 is electrically connected to the output control module 200 and used for pulling the scanning signal G(n) down to be at low level. The pull-up holding module 400 is electrically connected to the output terminal OUT and the second gate turn-on signal Gas2 and used for keeping the scanning signal G(n) output by the output terminal OUT at high level when receiving the second gate turn-on signal Gas2.

The output control module 200 comprises a fifth transistor T5, a sixth transistor T6, and a capacitor C1. A gate of the fifth transistor 15 is electrically connected to a first constant voltage VGH. A drain of the fifth transistor 15 is electrically connected to a controlling node Q(n). A gate of the sixth transistor T6 is electrically connected to a source of the fifth transistor T5. A drain of the sixth transistor T6 is electrically connected to a second, clock signal CKV2. A source of the sixth transistor T6 is electrically connected to an output terminal OUT. Two terminals of the capacitor C1 are connected to the source and gate of the sixth transistor T6, respectively.

The pull-down 300 comprises a seventh transistor T7 and an eighth transistor T8. A gate of the seventh transistor T7 is electrically connected to the first gate turn-on signal Gas1. A drain of the seventh transistor T7 is electrically connected to the output terminal OUT and the source of the sixth transistor T6. A gate of the eighth transistor T8 is electrically connected to a fourth clock signal CKV4. A drain of the eighth transistor T8 is electrically connected to a source of the seventh transistor T7. A source of the eighth transistor T8 is electrically connected to a second constant voltage VGL.

The pull-up holding module 400 comprises a ninth transistor T9 and a tenth transistor T10. A gate of the ninth transistor T9 is electrically connected to a second gate turn-on signal Gas2. A drain of the ninth transistor T9 is electrically connected to a controlling node Q. A source of the ninth transistor T9 is electrically connected to the second constant voltage VGL. A gate of the tenth transistor T10 is electrically connected to the second gate turn-on signal Gas2. A drain of the tenth transistor T10 is electrically connected to the first constant voltage VGH. A source of the tenth transistor T10 is electrically connected to the output terminal OUT.

Each of transistors is an N-type metal oxide semiconductor (NMOS) transistor as shown in FIG. 2. The first constant voltage VGH is at high level. The second constant voltage VGL is at low level. The first gate turn-on signal Gas1 is an inversion of the second gate turn-on signal Gas2, and vice versa. The pulse of the first clock signal CKV1, the pulse of the second clock signal CKV2, the pulse of the third clock signal CKV3, and the pulse of the fourth clock signal CKV4 are alternatively output. Also, the four pulses never overlap with one another.

Figure 3:
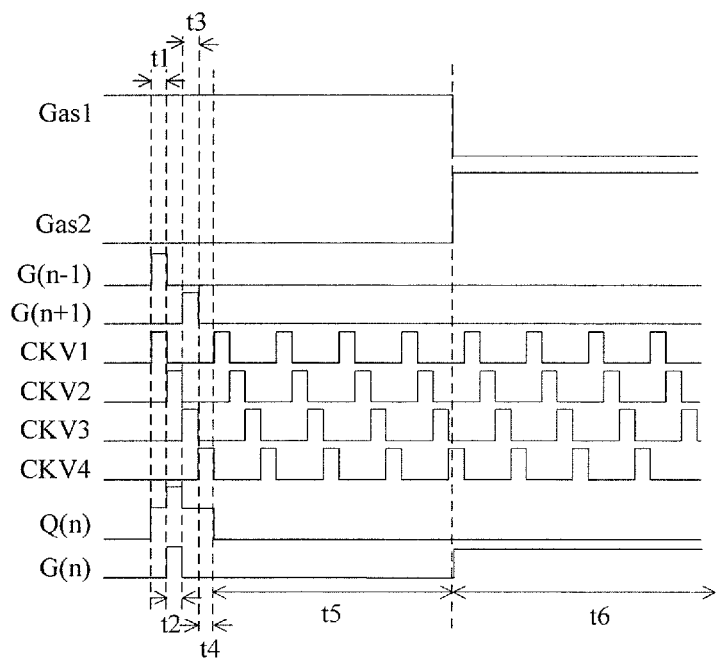
FIG. 3 is a sequence diagram of a variety of input signals, output signals, and node voltage shown in FIG. 2 in forward scanning.

Please refer to FIG. 2 and FIG. 3. FIG. 3 is a sequence diagram of a variety of input signals, output signals, and node voltage shown in FIG. 2 in forward scanning. When the GOA circuit unit SR(n) at each stage receives the first gate turn-on signal Gas1 at high level, the second gate turn-on signal Gas2 is at low level. At this time, all of the GOA circuit units SR(n) output scanning signals G(n) at the output terminal OUT according to the scanning signal G(n−1) output by the GOA circuit unit SR(n−1) at the previous stage and the scanning signal G(n+1) output by the GOA circuit unit SR(n+1) at the next stage. Specifically, the first gate turn-on signal Gas1, the first clock signal CKV1, and the scanning signal G(n−1) are at high level during the period of t1 as shown in FIG. 3. Meanwhile, the first and second transistors T1, T2 are turned on. The scanning signal G(n−1) at high level is transmitted to the controlling node Q through the first and second transistors T1, T2. Also, the controlling signal Q(n) is at high level at this time. Since the first constant voltage VGH is at high level, the fifth transistor T5 keeps being turned on, and the controlling signal Q(n) at high level is conducted by fifth transistor T5 to charge the capacitor C1. During the period of t2, the second clock signal CKV2 at high level is conducted by the sixth transistor T6 and sent to the output terminal OUT because the capacitor C1 has capacitors. So the scanning signal G(n) becomes at high level. During the period of t3, the first gate turn-on signal Gas1, the third clock signal CKV3, and the scanning signal G(n+1) are at high level. Meanwhile, the third and fourth transistors T3, T4 are turned on. The scanning signal G(n+1) at high level is transmitted to the controlling node Q through the third and fourth transistors T3, T4. The second clock signal CKV2 at low level is conducted by the sixth transistor T6 and sent to the output terminal OUT. So the scanning signal G(n) becomes at low level. During the period of t4, the first gate turn-on signal Gas1 and the fourth clock signal CKV4 are at high level. Meanwhile, the seventh and eighth transistors T7, T8 are turned on. The second constant voltage VGL at low level is transmitted to the output terminal OUT through the seventh and eighth transistors T7, T8. So the scanning signal G(n) becomes at low level. During the period of t5, the first gate turn-on signal Gas1 and the first clock signal CKV1 are at high level. At the same time, the first and second transistors T1, T2 are turned on. The scanning signal G(n−1) at low level is transmitted to the controlling node Q through the first and second transistors T1, T2. Also, the controlling signal Q(n) is at low level at this time.

The first gate turn-on signal Gas1 is at low level during the period of t6 so the second, third, and seventh transistors T2, T3, T7 are disconnected. The second gate turn-on signal Gas2 is at high level during the period of t6 so the ninth and tenth transistors T9, T10 are turned on. At this time, the ninth transistor T9 is turned on for the second constant voltage VGL at low level to the controlling node Q. The tenth transistor T10 is turned on for the first constant voltage VGH at high level to the output terminal OUT. So the controlling signal Q(n) is at low level, and the scanning signal G(n) is at high level. All of the GOA circuit units SR(n) keep outputting the scanning signal G(n) at high level for a period of time during the period of t6, i.e., at the stage of all gate on. At this time, the source driver 16 (as shown FIG. 1) outputs a data signal with a specific grayscale (such as black grayscale) to all of the pixel units 20 to clear the remaining charges in the capacitor of the pixel. It helps reduce image sticking.

Figure 4:
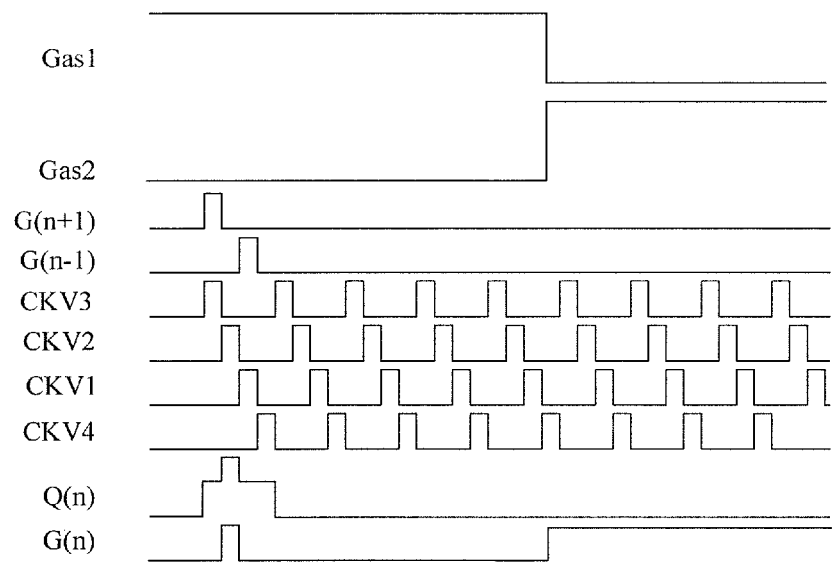
FIG. 4 is a sequence diagram of a variety of input signals, output signals, and node voltage shown in FIG. 2 in backward scanning.

FIG. 4 is a sequence diagram of a variety of input signals, output signals, and node voltage shown in FIG. 2 in backward scanning. FIG. 4 is different from FIG. 3 because a slight difference between the timing of forward scanning and the timing of backward scanning. However, it is understood by the people skilled in the field that the timing of forward scanning is different from the timing of backward scanning upon observing the structure of the GOA circuit unit SR(n) shown in FIG. 2. No further details are described in this specification.

Each of the transistors in this embodiment is an NMOS transistor as described above. But it is only an example for demonstration. The people skilled in the field are able to fabricate a GOA circuit unit comprising a P-type metal-oxide-semiconductor (PMOS) transistor based on the circuit proposed by the present invention. No further details are described in this specification.

The GOA circuit unit SR(n) proposed by this embodiment comprises ten transistors. Because the GOA circuit unit SR(n) uses fewer transistors, it is good for being used in displays with a narrow bezel. In addition, the GOA circuit unit SR(n) comprises the input control module 100 comprising the second transistor T2 and the third transistor T3 controlled by the first gate turn-on signal Gas1. The first transistor T1 and the second transistor T2 are connected in series, and the third transistor T3 and the fourth transistor T4 are connected in series, which reduces leakage current. It provides a beneficiary effect that the stability of the GOA circuit unit SR(n) is improved.

Figure 5:
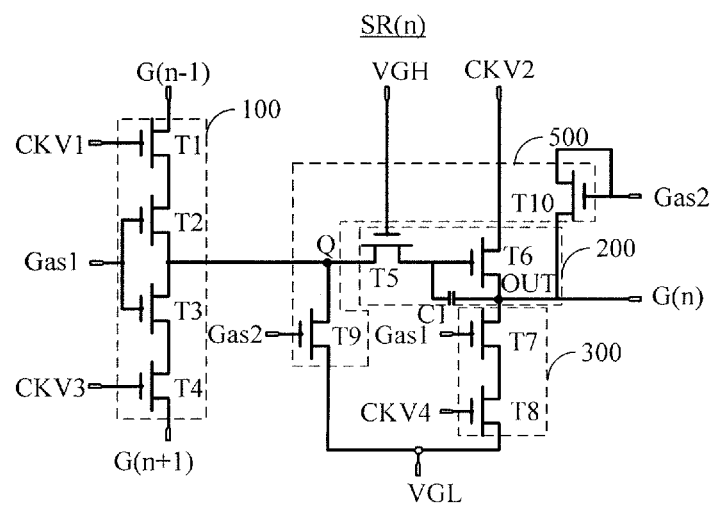
FIG. 5 is a circuit diagram of a GOA circuit unit SR(n) according to a second embodiment of the present invention.

Please refer to FIG. 5. FIG. 5 is a circuit diagram of a GOA circuit unit SR(n) according to a second embodiment of the present invention. Different from the pull-up holding module 400 shown in FIG. 2, a pull-up holding module 500 shown in FIG. 5 comprises a ninth transistor T9 and a tenth transistor T10. A gate of the ninth transistor T9 is electrically connected to a second gate turn-on signal Gas2. A drain of the ninth transistor T9 is electrically connected to a controlling node Q. A source of the ninth transistor T9 is electrically connected to a second constant voltage VGL. A gate and a drain of the tenth transistor T10 are electrically connected to the second gate turn-on signal Gas2. A source of the tenth transistor T10 is electrically connected to an output terminal OUT. That is, when the second gate turn-on signal Gas2 is at high level, the tenth transistor T10 transmits the second gate turn-on signal Gas2 at high level to the output terminal OUT where the second gate turn-on signal Gas2 is used as a scanning signal G(n). The relationship of other components used in this embodiment in connection is the same as that shown in FIG. 2 to FIG. 4. No further details are described in this specification.

In contrast to prior art, the GOA circuit unit at each stage comprises ten transistors in the present invention. Because the GOA circuit unit SR(n) proposed by the present invention comprises fewer transistors, it is good for being used in displays with a narrow bezel. In addition, the GOA circuit unit SR(n) comprises an input control module 100 comprising a second transistor T2 and a third transistor t3 controlled by a first gate turn-on signal Gas1. A first transistor T1 and the second transistor T2 are connected in series, and the third transistor T3 and a fourth transistor T4 are connected in series, which reduces leakage current. It provides a beneficiary effect that the stability of the GOA circuit unit is improved.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A gate driver on array (GOA) circuit, comprising:
a plurality of GOA circuit units coupled in series, each GOA circuit unit for outputting a scanning signal at an output terminal according to a scanning signal output by a GOA circuit unit at a previous stage, a scanning signal output by a GOA circuit unit at a next stage, a first clock signal, a second clock signal, a third clock signal, a fourth clock signal, a first gate turn-on signal, and a second gate turn-on signal, wherein each GOA circuit unit comprises:
an input control module, for outputting a controlling signal at a controlling node according to the first clock signal, the third clock signal, and the first gate turn-on signal, comprising:
a first transistor, comprising a gate electrically connected to the first clock signal, a drain electrically connected to the scanning signal output by the GOA circuit unit at the previous stage;
a second transistor, comprising a gate electrically connected to the first gate turn-on signal, a drain electrically connected to a source of the first transistor, and a source electrically connected to the controlling node;
a third transistor, comprising a gate electrically connected to the first gate turn-on signal, and a drain electrically connected to a source of the second transistor; and
a fourth transistor, comprising a gate electrically connected to the third clock signal, a drain electrically connected to a source of the third transistor, and a source electrically connected to the scanning signal output by the GOA circuit unit at the next stage;
an output control module, electrically connected to the controlling node, for outputting the scanning signal at the output terminal according to the controlling signal and the second clock signal;
a pull-down module, electrically connected to the output control module, for pulling the scanning signal down to be at low level; and
a pull-up holding module, electrically connected to the output terminal and the second gate turn-on signal, for keeping the scanning signal output by the output terminal at high level when receiving the second gate turn-on signal.

2. The GOA circuit of claim 1, wherein the output control module comprises:
a fifth transistor, comprising a gate electrically connected to a first constant voltage, and a drain electrically connected to the controlling node;
a sixth transistor, comprising a gate electrically connected to a source of the fifth transistor, a drain electrically connected to the second clock signal, and a source electrically connected to the output terminal; and
a capacitor, comprising two terminals connected to the source and the gate of the sixth transistor, respectively.

3. The GOA circuit of claim 2, wherein the pull-down module comprises:
a seventh transistor, comprising a gate electrically connected to the first gate turn-on signal, and a drain electrically connected to the output terminal and the source of the sixth transistor;
an eighth transistor, comprising a gate electrically connected to the fourth clock signal, a drain electrically connected to a source of the seventh transistor, and a source electrically connected to a second constant voltage.

4. The GOA circuit of claim 3, wherein the pull-up holding module comprises:
a ninth transistor, comprising a gate electrically connected to the second gate turn-on signal, a drain electrically connected to the controlling node, and a source electrically connected to the second constant voltage;
a tenth transistor, comprising a gate electrically connected to the second gate turn-on signal, a drain electrically connected to the first constant voltage, and a source electrically connected to the output terminal.

5. The GOA circuit of claim 3, wherein the pull-up holding module comprises:
a ninth transistor, comprising a gate electrically connected to the second gate turn-on signal, a drain electrically connected to the controlling node, and a source electrically connected to the second constant voltage; and
a tenth transistor, comprising a gate and a drain electrically connected to the second gate turn-on signal, and a source electrically connected to the output terminal.

6. The GOA circuit of claim 1, wherein a pulse of the first clock signal, a pulse of the second clock signal, a pulse of the third clock signal, and a pulse of the fourth clock signal are alternatively output, and time periods of the four pulses never overlap with one another.

7. The GOA circuit of claim 4, wherein the first constant voltage is at high level, and the second constant voltage is at low level.

8. The GOA circuit of claim 1, wherein the first gate turn-on signal is an inversion of the second gate turn-on signal, and the second gate turn-on signal is an inversion of the first gate turn-on signal.

9. A display comprising:
a source driver, for outputting data signal to a plurality of pixel units to show grey levels;
a gate driver on array (GOA) circuit, for outputting scanning signal to turn on transistors, the GOA circuit comprising:
a plurality of GOA circuit units coupled in series, each GOA circuit unit for outputting a scanning signal at an output terminal according to a scanning signal output by a GOA circuit unit at a previous stage, a scanning signal output by a GOA circuit unit at a next stage, a first clock signal, a second clock signal, a third clock signal, a fourth clock signal, a first gate turn-on signal, and a second gate turn-on signal, wherein each GOA circuit unit comprises:
an input control module, for outputting a controlling signal at a controlling node according to the first clock signal, the third clock signal, and the first gate turn-on signal, comprising:
a first transistor, comprising a gate electrically connected to the first clock signal, a drain electrically connected to the scanning signal output by the GOA circuit unit at the previous stage;
a second transistor, comprising a gate electrically connected to the first gate turn-on signal, a drain electrically connected to a source of the first transistor, and a source electrically connected to the controlling node;
a third transistor, comprising a gate electrically connected to the first gate turn-on signal, and a drain electrically connected to a source of the second transistor; and
a fourth transistor, comprising a gate electrically connected to the third clock signal, a drain electrically connected to a source of the third transistor, and a source electrically connected to the scanning signal output by the GOA circuit unit at the next stage;
an output control module, electrically connected to the controlling node, for outputting the scanning signal at the output terminal according to the controlling signal and the second clock signal;
a pull-down module, electrically connected to the output control module, for pulling the scanning signal down to be at low level; and
a pull-up holding module, electrically connected to the output terminal and the second gate turn-on signal, for keeping the scanning signal output by the output terminal at high level when receiving the second gate turn-on signal.

10. The display of claim 9, wherein the output control module comprises:

a fifth transistor, comprising a gate electrically connected to a first constant voltage, and a drain electrically connected to the controlling node;
a sixth transistor, comprising a gate electrically connected to a source of the fifth transistor, a drain electrically connected to the second clock signal, and a source electrically connected to the output terminal; and
a capacitor, comprising two terminals connected to the source and the gate of the sixth transistor, respectively.

11. The display of claim 10, wherein the pull-down module comprises:
a seventh transistor, comprising a gate electrically connected to the first gate turn-on signal, and a drain electrically connected to the output terminal and the source of the sixth transistor;
an eighth transistor, comprising a gate electrically connected to the fourth clock signal, a drain electrically connected to a source of the seventh transistor, and a source electrically connected to a second constant voltage.

12. The display of claim 11, wherein the pull-up holding module comprises:
a ninth transistor, comprising a gate electrically connected to the second gate turn-on signal, a drain electrically connected to the controlling node, and a source electrically connected to the second constant voltage;
a tenth transistor, comprising a gate electrically connected to the second gate turn-on signal, a drain electrically connected to the first constant voltage, and a source electrically connected to the output terminal.

13. The display of claim 11, wherein the pull-up holding module comprises:
a ninth transistor, comprising a gate electrically connected to the second gate turn-on signal, a drain electrically connected to the controlling node, and a source electrically connected to the second constant voltage; and
a tenth transistor, comprising a gate and a drain electrically connected to the second gate turn-on signal, and a source electrically connected to the output terminal.

14. The display of claim 9, wherein a pulse of the first clock signal, a pulse of the second clock signal, a pulse of the third clock signal, and a pulse of the fourth clock signal are alternatively output, and time periods of the four pulses never overlap with one another.

15. The GOA circuit of claim 12, wherein the first constant voltage is at high level, and the second constant voltage is at low level.

16. The display of claim 9, wherein the first gate turn-on signal is an inversion of the second gate turn-on signal, and the second gate turn-on signal is an inversion of the first gate turn-on signal.

* * * * *